(12) United States Patent
Pendharkar

(10) Patent No.: US 8,304,303 B2
(45) Date of Patent: Nov. 6, 2012

(54) DRAIN EXTENDED PMOS TRANSISTORS AND METHODS FOR MAKING THE SAME

(75) Inventor: Sameer Pendharkar, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 12/273,850

(22) Filed: Nov. 19, 2008

(65) Prior Publication Data

US 2009/0068804 A1 Mar. 12, 2009

Related U.S. Application Data

(62) Division of application No. 11/012,469, filed on Dec. 15, 2004, now Pat. No. 7,468,537.

(51) Int. Cl.
*H01L 21/336* (2006.01)

(52) U.S. Cl. ..... 438/195; 257/335; 257/334; 257/E27.1; 257/E27.112; 257/E27.125

(58) Field of Classification Search ............. 257/335, 257/334, E27.1, E27.112, E27.125; 438/195
See application file for complete search history.

(56) References Cited

U.S. PATENT DOCUMENTS

| | | | |
|---|---|---|---|
| 5,852,314 A | 12/1998 | Depetro et al. | |
| 5,976,942 A | 11/1999 | Ludikhuize | |
| 6,211,552 B1 | 4/2001 | Efland et al. | |
| 6,225,181 B1 | 5/2001 | Gregory | |
| 6,288,424 B1 * | 9/2001 | Ludikhuize | 257/335 |
| 6,376,891 B1 | 4/2002 | Nagatani et al. | |
| 6,395,593 B1 | 5/2002 | Pendharkar et al. | |
| 6,475,870 B1 | 11/2002 | Huang et al. | |
| 6,531,355 B2 | 3/2003 | Mosher et al. | |
| 6,548,874 B1 | 4/2003 | Morton et al. | |
| 6,593,621 B2 | 7/2003 | Tsuchiko et al. | |
| 6,624,481 B1 | 9/2003 | Pendharkar et al. | |
| 6,729,886 B2 | 5/2004 | Efland et al. | |
| 6,734,493 B2 | 5/2004 | Chen et al. | |
| 6,882,023 B2 | 4/2005 | Khemka et al. | |
| 6,888,710 B2 | 5/2005 | Mallikarjunaswamy et al. | |
| 6,909,143 B2 | 6/2005 | Jeon et al. | |
| 6,911,696 B2 | 6/2005 | Denison | |
| 6,914,294 B2 | 7/2005 | Nakamura et al. | |
| 6,924,531 B2 | 8/2005 | Chen et al. | |
| 7,110,232 B2 | 9/2006 | Ausserlechner | |
| 7,187,033 B2 | 3/2007 | Pendharkar | |
| 7,427,795 B2 | 9/2008 | Pendharkar | |
| 2002/0053695 A1 | 5/2002 | Liaw et al. | |
| 2003/0173624 A1* | 9/2003 | Choi et al. | 257/368 |
| 2004/0084744 A1* | 5/2004 | Khemka et al. | 257/492 |

* cited by examiner

*Primary Examiner* — Marc Armand
(74) *Attorney, Agent, or Firm* — Warren L. Franz; Wade J. Brady, III; Frederick J. Telecky, Jr.

(57) ABSTRACT

Semiconductor devices (102) and drain extended PMOS transistors (CT1*a*) are provided, as well as fabrication methods (202) therefor, in which a p-type separation region (130) is formed between an n-buried layer (108) and the transistor backgate (126) to increase breakdown voltage performance without increasing epitaxial thickness.

13 Claims, 5 Drawing Sheets

DRAIN EXTENDED PMOS TRANSISTORS AND METHODS FOR MAKING THE SAME

FIELD OF INVENTION

The present invention relates generally to semiconductor devices and improved drain extended PMOS transistors as well as fabrication methods for making the same.

BACKGROUND OF THE INVENTION

Power semiconductor products are often fabricated using N or P channel drain-extended metal-oxide-semiconductor (DEMOS) transistor devices for high power switching applications. DEMOS devices advantageously combine short-channel operation with high current handling capabilities, relatively low drain-to-source on-state resistance (Rdson), and the ability to withstand high blocking voltages without suffering voltage breakdown failure (high breakdown voltage ratings). Breakdown voltage is typically measured as drain-to-source breakdown voltage with the gate and source shorted together (BVdss), where DEMOS device designs often involve a tradeoff between breakdown voltage BVdss and Rdson.

Referring to FIGS. 1A and 1B, a conventional drain extended PMOS control transistor CT1 is illustrated in FIG. 1A in an integrated circuit or semiconductor device 2 with a p-type drain 24 spaced from a gate 14, 16 having sidewall spacers 20. FIG. 1B provides a schematic illustration of one high voltage application in which the DEPMOS transistor CT1 is used. As illustrated in FIG. 1A, the transistor CT1 is formed in a p-doped silicon substrate 4 (P+) with a lower epitaxial silicon 4a (P-lower epi) formed over the substrate 4, where a p-type upper epitaxial silicon 6 (upper epi) is formed over the lower epi 4a, and an n-buried layer 8 (NBL) extends in an upper portion of the lower epi 4a and a lower portion of the upper epi 6. An n-well 12 is formed in an upper portion of the upper epi 6, leaving a p-type drift region 6a outside the n-well 12, and various field oxide (FOX) isolation structures 10 are formed to separate different terminals of the transistor CT1 from one another and from other components in the integrated circuit device 2.

A p-type source (S) 22 is formed in the n-well 12 along one side of a channel region 28 of the n-well 12, and an n-type backgate (BG) 26, in the illustrated example, is spaced from the source 22 in the n-well 12. A p-type extended drain (D) 24 is formed in the drift region 6a, and is spaced from the other side of the channel 28. The transistor gate structure (G) includes a thin gate dielectric or gate oxide 14 formed over the channel region 28 of the n-well 12, which also partially overlies a portion of the p-drift region 6a, with a conductive gate electrode 16 formed over the thin gate oxide 14 and sidewall spacers 20 formed along the lateral sides of the gate.

As illustrated in FIG. 1B, the conventional DEPMOS CT1 of FIG. 1A is employed as a control transistor for driving the gate of a bridge high-side driver DENMOS. FIG. 1B illustrates a half H-bridge driver circuit in the semiconductor device 2 powered by a DC supply voltage VCC, with the conventional DEPMOS control transistor CT1 of FIG. 1A and a DENMOS control transistor CT2 together forming an inverter for controlling a gate voltage of a high-side DENMOS drive transistor T2 in the half bridge circuit. The circuit includes two load driving n-channel power devices such as DENMOS or LDMOS (lateral diffused MOS) devices T1 and T2 having corresponding sources S1 and S2, drains D1 and D2, and gates G1 and G2, respectively, coupled to drive an inductive load. The transistors T1 and T2 are arranged as a pair of low and high-side drivers, respectively, with the load coupled between an intermediate node N1 of the driver pair and ground.

A supply voltage VCC is coupled to the drain D2 of the high-side driver T2, and can be a positive terminal of a battery source, wherein the ground may be the battery negative terminal, for example, in automotive applications. The low-side driver T1 and the high-side driver T2 are coupled in series between the supply voltage VCC and ground, where the high side driver transistor T2 has a drain D2 coupled to VCC and a source S2 coupled with the intermediate node N1 at the load. The low-side transistor T1 has a drain D1 coupled to the node N1 and a source S1 coupled to ground. The intermediate node N1 between the transistors T1 and T2 is coupled to a first terminal of a load and the other load terminal is coupled to ground, wherein the load is typically not a part of the device 2. The low and high side transistor gates G1 and G2 are controlled so as to drive the load in alternating fashion, wherein an inverter CT1, CT2 (including the DEPMOS transistor CT1 of FIG. 1A) is illustrated to drive the high-side gate G2. When the high-side transistor T2 is on, current flows through the high-side transistor T2 and the load in a first direction, and when the low-side transistor T1 is on, current flows through the load and the low-side transistor T1 in a second opposite direction.

In the illustrated device 2, the source S of the DEPMOS control transistor CT1 is coupled to a high voltage VCC+ VGS, where VGS is the gate-to-source voltage required to turn the high-side device T2 on, and VCC is the supply voltage. In this configuration, the upper control transistor CT1 must be designed to withstand high drain-to-source voltages without breakdown when the upper control transistor CT1 is off and the lower control transistor CT2 is on. In this condition, the drain D of the transistor CT1 is essentially at ground potential, while the source S remains at VCC+VGS. In automotive and other applications in which bridge driver circuits are used for high wattage digital audio equipment or in other high power circuits, the supply voltage VCC can be very high, such as 65 to 80 volts DC, wherein the driver devices T1 and T2 need to withstand drain-to-source voltages of about VCC without breakdown. Furthermore, the DEPMOS control transistor CT1 needs to withstand even higher drain-to-source voltages, since the drain D of the upper control transistor CT1 may be near ground potential when the lower control transistor CT2 is on. In particular, the VGS of the high-side driver transistor T2 may be 5 to 15 volts DC, wherein the off-state drain-to-source voltage across the DEPMOS transistor CT1 may be 100 volts or more.

As shown in FIG. 1A, the drain region 24 is spaced from the channel 28 and from the gate 14, 16 (e.g., an extended-drain architecture) to provide the drift region 6a in the p-type epitaxial silicon 6 between the channel 28 and the drain 24. In operation, the spacing of the drain 24 and the channel 28 spreads out the electric fields, thereby increasing the breakdown voltage rating of the device (higher BVdss). However, the drain extension increases the resistance of the drain-to-source current path (Rdson), whereby DEMOS device designs often involve a tradeoff between high breakdown voltage BVdss and low Rdson.

Another breakdown voltage limitation of the transistor CT1 relates to the thickness of the epitaxial silicon 6 in the device 2, wherein the substrate 4 is grounded and the transistor source, drain, and channel (e.g., including the n-well 12 and the p-drift region 6a) are formed in the epitaxial silicon 6. In particular, when the control transistor CT1 is on, the drain voltage is very high, and it is desirable to separate the p-type drain 24 and the drift region 6a from the underlying p-type substrate 4 that is grounded, to prevent punch-thru current between the drain 24 and the substrate 4. Accordingly, a rather heavily doped n-buried layer 8 is typically formed prior to forming the upper epitaxial silicon layer 6, in order to separate the drift region 6a and the drain 24 from the substrate 4, and to thereby inhibit on-state punch-thru current, with the n-buried layer 8 typically being connected to the n-type backgate 26 through the n-well 12, whereby the n-buried layer 8 is tied to the source voltage (VCC+VGS). However, the presence of the n-buried later at such a high voltage may lead to off-state breakdown when the drain 24 is near ground potential. Thus, while the n-buried layer 8 operates to prevent on-state punch-thru current, the n-buried layer 8 limits the off-state breakdown voltage rating of the DEPMOS transistor CT1 for a given epitaxial thickness and drift region doping amount.

In an "off" state of the transistor CT1, the drain 24 is essentially at ground, and the source voltage VCC+VGS is dropped across the drift region 6a portion extending between the bottom of the drain 24 and the n-buried layer 8, and also between the channel-side of the drift region 6a and the drain 24. If the breakdown occurs on the surface between the gate 16 and the p-type drain 24, the lateral extension of the drift region 6a can be increased (e.g., the lateral spacing of the drain 24 from the gate 16 may be increased to prevent lateral breakdown). However, the vertical spacing between the bottom of the p-type drain 24 and the n-buried layer 8 is more difficult to increase. One approach is to increase the thickness of the epitaxial silicon layer 6, wherein a thicker layer 6 allows a deeper drift region 6a to support higher voltages without suffering breakdown. However, increasing the epitaxial thickness is costly in terms of process complexity, larger spacing requirements, and larger design rules, particularly in forming the deep diffusions to connect to the n-buried layer 8 or other buried layers in the device 2. Accordingly, there is a need for improved DEPMOS devices and fabrication methods by which increased voltage breakdown withstanding capabilities can be achieved, without increasing epitaxial silicon thicknesses and without sacrificing device performance.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The present invention relates to improved drain extended PMOS (DEPMOS) transistors and fabrication methods therefor, in which a p-type separation region, such as a p-buried layer, is formed between an n-buried layer and a DEPMOS transistor backgate to increase breakdown voltage performance without increasing epitaxial thickness.

One aspect of the invention provides a semiconductor device, comprising an n-buried layer formed in a semiconductor body, a drain-extended PMOS transistor formed above the n-buried layer, and a p-type separation region formed between the n-buried layer and an n-type backgate of the transistor. In one implementation, the n-buried layer is electrically floating, whereby part of the drain-to-source voltage in the off state is dropped across the separation region (leading to the n-buried layer voltage being biased to a voltage between the drain and source voltages), and the rest is dropped between the p-type drain and the n-buried layer. This floating n-buried layer configuration thus allows increased transistor breakdown voltage ratings without increasing the epitaxial layer thickness, even for high voltage applications.

Another aspect of the invention provides a drain extended PMOS transistor, comprising a gate overlying an n-type channel region of a semiconductor body, a p-type source formed in the semiconductor body proximate a first lateral side of the gate, a p-type drift region extending laterally in the semiconductor body under a portion of the gate from the channel region beyond a second lateral side of the gate, a p-type drain formed in the drift region, where the drain is spaced from the second lateral side of the gate, and an n-type backgate. An n-buried layer is formed in the semiconductor body beneath at least a portion of the gate and the drain. The DEPMOS transistor further comprises a p-type separation region, which can be a p-buried layer or other p-type region that extends in the semiconductor body between the n-buried layer and the backgate.

Other aspects of the invention relate to methods for fabricating semiconductor devices and DEPMOS transistors. In these methods, an n-buried layer is formed in a semiconductor body, a drain-extended PMOS transistor is formed above the n-buried layer, and a p-type separation region is formed between the n-buried layer and an n-type backgate of the transistor to electrically separate the n-buried layer from the n-type backgate. The formation of the p-type separation regions may comprise forming a p-buried layer over a first portion of the n-buried layer in the semiconductor body, and the methods may comprise forming an epitaxial silicon over the p-buried layer and a second portion of the n-buried layer prior to forming the drain extended PMOS transistor.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1A:
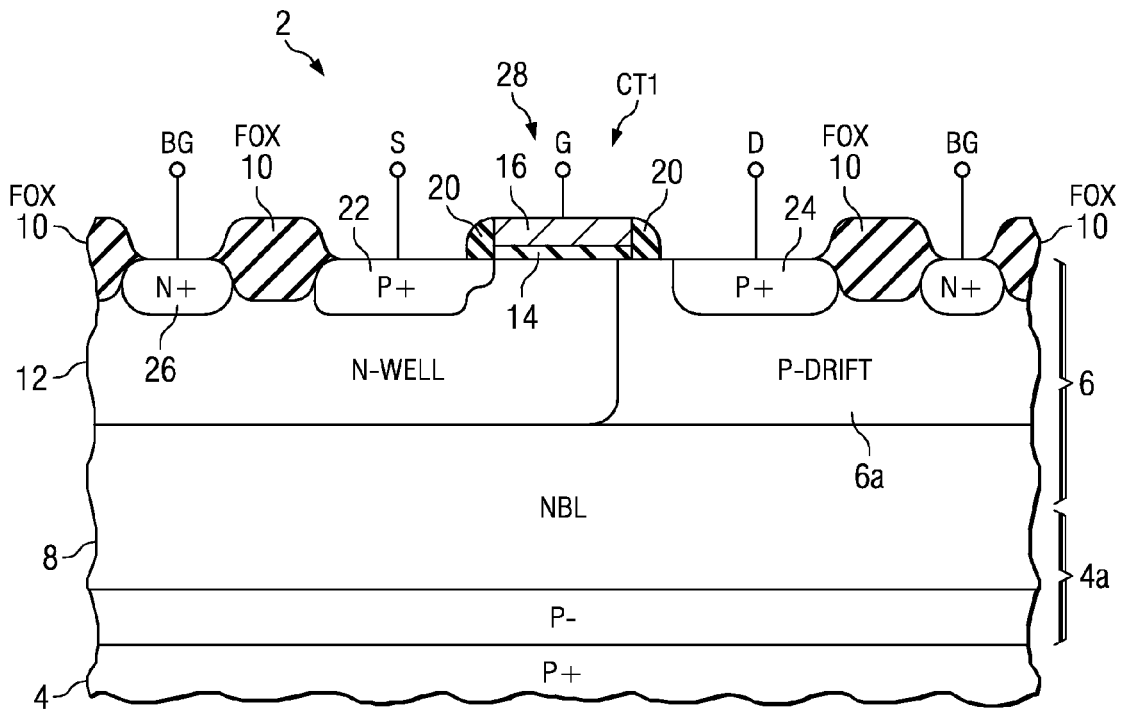
FIG. 1A is a partial side elevation view in section illustrating a semiconductor device having a conventional drain extended PMOS transistor with an n-buried layer under the transistor to inhibit punch-thru.

One or more implementations of the present invention will now be described with reference to the attached drawings, wherein like reference numerals are used to refer to like elements throughout, and wherein the illustrated structures are not necessarily drawn to scale. The invention provides drain extended PMOS (DEPMOS) transistors and fabrication techniques by which various shortcomings of conventional DEPMOS transistors can be mitigated or overcome, and which may be employed to facilitate increased breakdown voltage ratings without increased epitaxial silicon thicknesses.

Figure 1B:
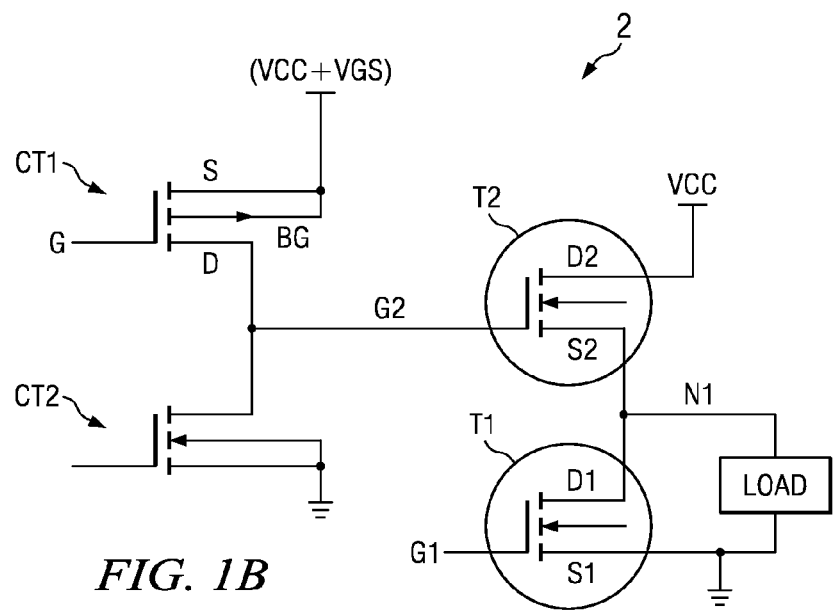
FIG. 1B is a schematic diagram illustrating a half H-bridge circuit for driving a load using low and high-side drain-extended NMOS devices, with an inverter that includes the conventional DEPMOS device of FIG. 1A for driving the high side device gate.
Figure 2:
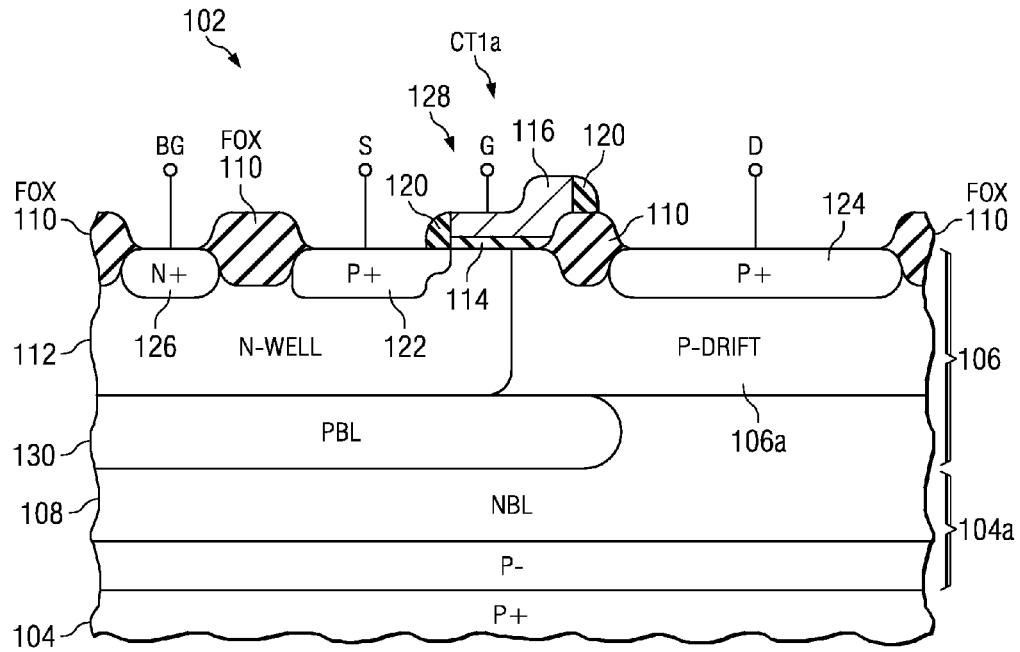
FIG. 2 is a partial side elevation view in section illustrating an exemplary drain extended PMOS transistor (DEPMOS) with a p-type separation region extending between an n-buried layer and an n-type backgate of the DEPMOS transistor in accordance with the invention.

Referring now to FIG. 2, an exemplary DEPMOS transistor CT1a is illustrated in a semiconductor device 102 in accordance with the present invention. The transistor CT1a may be employed in any type of circuit, and provides particular advantages in applications requiring high breakdown voltage withstanding capabilities, such as in the upper inverter transistor of FIG. 1B for controlling the gate voltage G2 of a high-side bridge driver transistor. The device 102 is formed in a composite semiconductor body 104, 106, beginning with a p-doped silicon substrate 104 (P+), where a lower epitaxial silicon 104a (P-lower epi) is formed over the substrate 104, and a p-type upper epitaxial silicon 106 (upper epi) is formed over the lower epi 104a. The semiconductor devices and DEPMOS transistors of the present invention may be fabricated in any type of semiconductor body 104, including but not limited to semiconductor (e.g., silicon) wafers, silicon-over-insulator (SOI) wafers, epitaxial layers in a wafer, or other composite semiconductor bodies, etc., wherein the invention and the appended claims are not limited to the illustrated structures or materials.

An n-buried layer 108 (NBL) extends into an upper portion of the lower epi 104a and a lower portion of the upper epi 106. An n-well 112 is formed in an upper portion of the upper epi 106, leaving a p-type drift region 106a outside the n-well 112. Alternatively, a separate p-well (not shown) may be formed to provide the p-type drift region. Various field oxide (FOX) isolation structures 110 are formed to separate different terminals of the transistor CT1a from one another and from other components in the device 102, although other isolation structures may be used (e.g., shallow trench isolation (STI) structures, etc.).

In accordance with one or more aspects of the invention, the exemplary semiconductor device 102 comprises a drain-extended PMOS transistor CT1a formed above the n-buried layer 108, and a p-type separation region 130 formed between the n-buried layer 108 and an n-type backgate BG 126 of the transistor CT1a to electrically separate the n-buried layer 108 from backgate 126. In this example, the p-type separation region 130 is a p-buried layer (PBL) formed prior to formation of the upper epitaxial silicon 106. However, other implementations are possible where a p-type region is provided in a semiconductor body to separate an n-type backgate from an n-buried layer using any suitable fabrication techniques, where the p-type separation region 130 may be created before or after the formation of the upper epitaxial layer 106, wherein all such alternative implementations are contemplated as falling within the scope of the invention and the appended claims. For instance, one possible alternative could be to implant or otherwise form a p-well (not shown) within which the n-type backgate 126 is later formed, wherein a lower portion of such a p-well operates to separate the backgate 126 from the n-buried layer 108.

It is further noted that the n-buried layer 108 is electrically floating in the exemplary device 102. The floating n-buried layer 108, and the separation thereof from the backgate 126 via the p-separation region 130 facilitates increased DEPMOS transistor breakdown voltage ratings without increasing the epitaxial layer thickness, as described further hereinafter. For example, when the transistor CT1a is employed as the upper inverter transistor in the circuit of FIG. 1B above, a portion of the drain-to-source voltage in the off state is dropped across the separation region 130, with the remainder of the voltage being dropped between the p-type drain 124 and the n-buried layer 108.

This floating n-buried layer configuration thus allows the n-buried layer voltage to be at an intermediate value to spread the drain-to-source voltage, wherein the overall breakdown voltage rating for the transistor CT1a is no longer limited to the voltage withstanding capability between the drain 124 and the n-buried layer 108. Thus, for example, where the thickness of the epitaxial layer 106 and the doping thereof (e.g., the drift region doping and depth) is such that breakdown occurs at about 80 volts between the drain 124 and the n-buried layer 108, the floating n-buried layer 108 and the electrical separation thereof from the backgate 126 allows the n-buried layer 108 to attain a certain voltage between the drain voltage and the backgate/source voltage when the transistor CT1a is off, whereby a portion of the drain-to-source voltage drops between the n-buried layer 108 and the backgate 126, and the overall drain-to-source voltage can be much higher than 80 volts (e.g., 100 volts or more in one example), without suffering breakdown.

In this manner, the transistor breakdown voltage BVdss is essentially decoupled to an extent from the epitaxial thickness, and the breakdown voltage can be increased without having to make the upper epitaxial silicon 106 thicker. In this regard, the exemplary p-type separation buried layer 130 is doped with boron to about $3E13$ $cm^{-2}$ to provide a DEPMOS BVdss of about 108 volts in the device 102, wherein the n-buried layer voltage is less than about 80 volts. In general, the p-separation region doping, orientation, dimensions, etc. can be tuned for a particular transistor design, for example, such that the p-drift region/n-backgate diode depletes through the p-type separation region 130 before avalanche breakdown occurs, wherein all such implementations are contemplated as falling within the scope of the present invention and the appended claims.

As illustrated in FIG. 2, the exemplary DEPMOS transistor CT1a comprises a gate (G) 114, 116 having first and second lateral sides, including a thin gate dielectric 114 and an overlying conductive gate electrode 116, where the gate 114, 116 overlies an n-type channel region 128 in a semiconductor body 104. The exemplary channel 128 is created as a portion of an n-well 112 formed in the upper epitaxial silicon 106, although the use of the exemplary n-well structure 112 to form the channel 128 is not a strict requirement of the invention. A p-type source (S) 122 is formed in the semiconductor body within the n-well 112, along with an n-type backgate (BG) 126. The source 122 has first and second laterally opposite sides, with a first lateral side located along a first lateral side of the channel 128 proximate the first lateral side of the gate, where the second opposite side of the source 122 is separated from the backgate 126 by an isolation structure 110. In the present example, the source 122 is laterally spaced away from the backgate 126; alternatively, such regions are adjacent one another and tied to the same potential.

A p-type drift region 106a is provided, which extends laterally in the upper epitaxial silicon 106 of the composite semiconductor body under a portion of the gate 114, 116 from a second opposite lateral side of the channel region 128 beyond the second lateral side of the gate 114, 116. A p-type drain (D) 124 is formed in the drift region 106a, and is spaced from the second lateral side of the gate 114, 116 to provide an extended drain, wherein the n-buried layer 108 is situated in the upper and lower epitaxial silicon layers 106, 104a beneath at least a portion of the gate 114, 116 and the drain 124 to inhibit punch-thru currents from flowing between the drain 124 and the p-type substrate 104. Generally the n-well 112 is sufficient to prevent punchthrough between the p-type source 122 and the p-substrate 104, however, in the present example, for added punchthrough protection, the n-buried layer 108 is also present beneath the source region.

Figure 3:
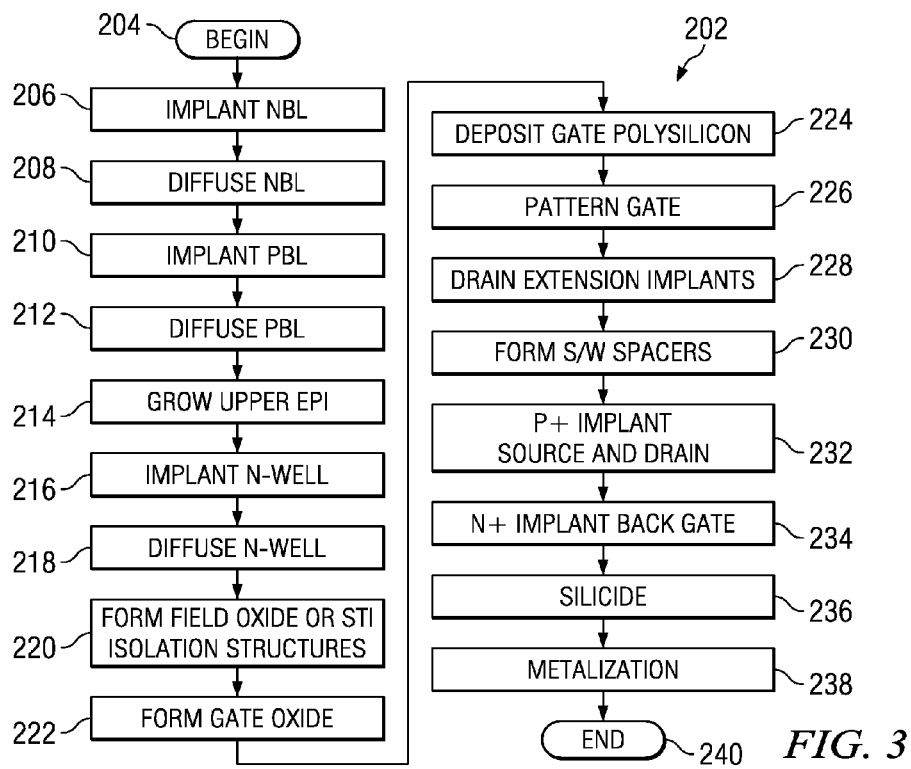
FIG. 3 is a flow diagram illustrating a method for fabricating a semiconductor device with a DEPMOS transistor in accordance with the invention.

Referring also to FIGS. 3 and 4A-4G, further aspects of the invention provide methods for semiconductor device and DEPMOS fabrication. FIG. 3 illustrates an exemplary method 202 for fabricating a semiconductor device and DEPMOS transistors in accordance with the invention, and FIGS. 4A-4G illustrate the exemplary semiconductor device 102 of FIG. 2 at various stages of fabrication generally in accordance with the method 202 of FIG. 3. Although the exemplary method 202 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of devices and DEPMOS transistors thereof which are illustrated and described herein as well as in association with other devices and structures not illustrated.

Figure 4A:
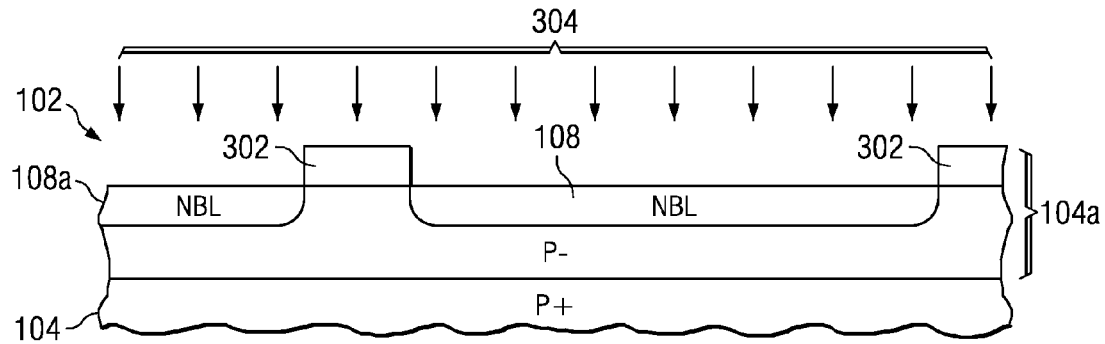
FIGS. 4A-4G are partial side elevation views in section illustrating an exemplary integrated circuit including a DEPMOS transistor at various stages of fabrication in accordance with the invention.

As illustrated in FIGS. 3 and 4A, the method 202 begins at 204, with an n-buried layer 108 being initially implanted at 206 into the lower epi layer 104a using an implant mask 302 and an implantation process 304, where the n-buried layer may optionally be thermally diffused at 208 following the implantation process 304. In the exemplary semiconductor device 102, an n-buried layer 108 is initially implanted or diffused in a prospective DEPMOS portion of the lower epitaxial silicon 104a, and other n-buried layers (e.g., layer 108a in FIG. 4A) may be concurrently formed for use in other transistors of the device 102, wherein the implanted n-type impurities may, but need not, extend into the silicon 104 beneath the lower epi layer 104a. Any suitable processing techniques may be used in forming an n-buried layer in a semiconductor body within the scope of the invention, including but not limited to implantation, diffusion, etc., using any suitable implantation mask 302, process 304, and equipment.

Figure 4B:
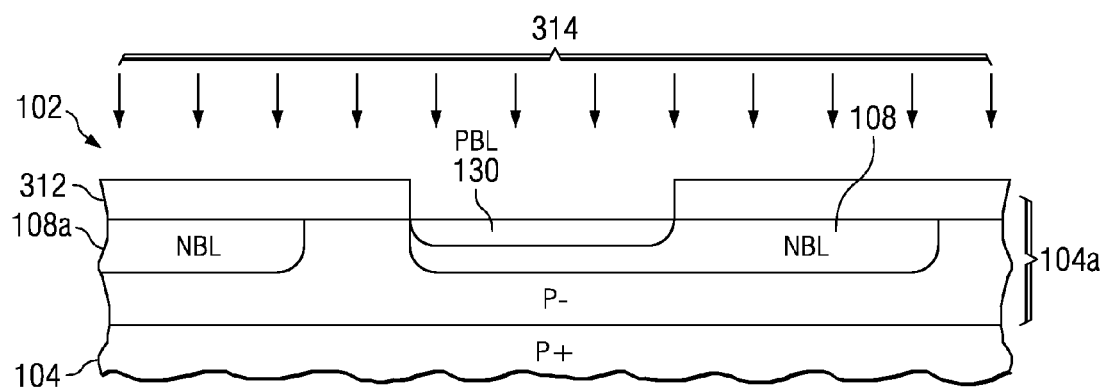

As illustrated in FIG. 4B, a p-buried layer 130 is implanted at 210 over a first portion of the n-buried layer 108 in the lower epitaxial layer 104a, where the p-buried layer 130 (e.g., and the n-buried layer 108) may optionally be thermally diffused at 212. As shown in FIG. 4B, a mask 312 is formed, which exposes the first portion of the n-buried layer 108 (e.g., corresponding to a desired location of the p-type separation region 130) in the prospective DEPMOS region of the upper epi layer 104a, and an implantation process 314 is performed to provide p-type dopants (e.g., boron, etc.) into the exposed portion of the n-buried layer 108, thereby creating a counter-doped p-buried layer 130 therein, wherein another diffusion anneal may optionally be performed at 212 to drive the implanted p-type dopants (and the n-type dopants of the n-buried layer 108) laterally and downward, thereby extending the p-buried layer 130 and the n-buried layer 108. Alternatively, the separation region 130 may be formed via a relatively high energy implant of a p-type region after the upper epi is formed.

Figure 4C:
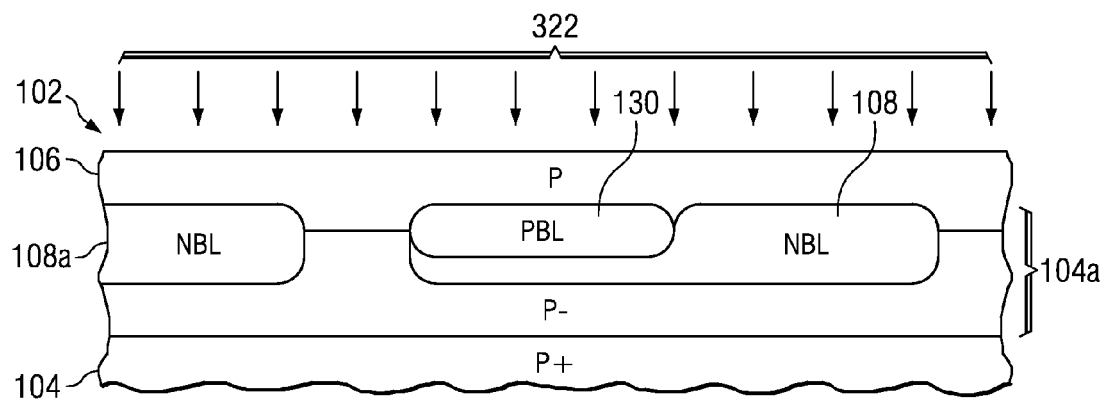

Referring also to FIG. 4C, an epitaxial growth process is performed at 214 to grow the upper epitaxial silicon layer 106 above the substrate 104 and the lower epi 104a, thereby forming a composite semiconductor body 104, 106, wherein the upper epitaxial silicon is provided with p-type dopants to form the p-type upper epitaxial silicon layer 106. Any suitable epitaxial growth processing may be employed at 214 by which an epitaxial silicon layer 106 is formed over the upper surface of the lower epi 104a. As shown in FIG. 4C, the upper epitaxial silicon layer 106 is formed using an epitaxial growth process 322, wherein thermal energy associated with the process 322 causes upward diffusion of a portion of the p-type dopants of the p-buried layer 130, whereby a portion of the p-buried layer 130 extends into the epitaxial silicon 106. Similarly, a second portion of the n-buried layer 108 may diffuse upward into the epitaxial silicon 106 outward of the p-buried layer 130. However, the p-buried layer 130 generally prevents or inhibits upward diffusion of at least the first portion of the n-buried layer 108, both during the epitaxial process 322 at 214 and afterwards, and provides a physical and electrical barrier between the n-buried layer 108 and a subsequently formed backgate 126 of the DEPMOS transistor CT1a (e.g., as shown in FIG. 2). Moreover, a first portion of the p-type upper epi layer 106 provides a p-type drift region in the subsequently completed DEPMOS device. Alternatively, the p-drift region may be formed via an implant, as may be desired.

Figure 4D:
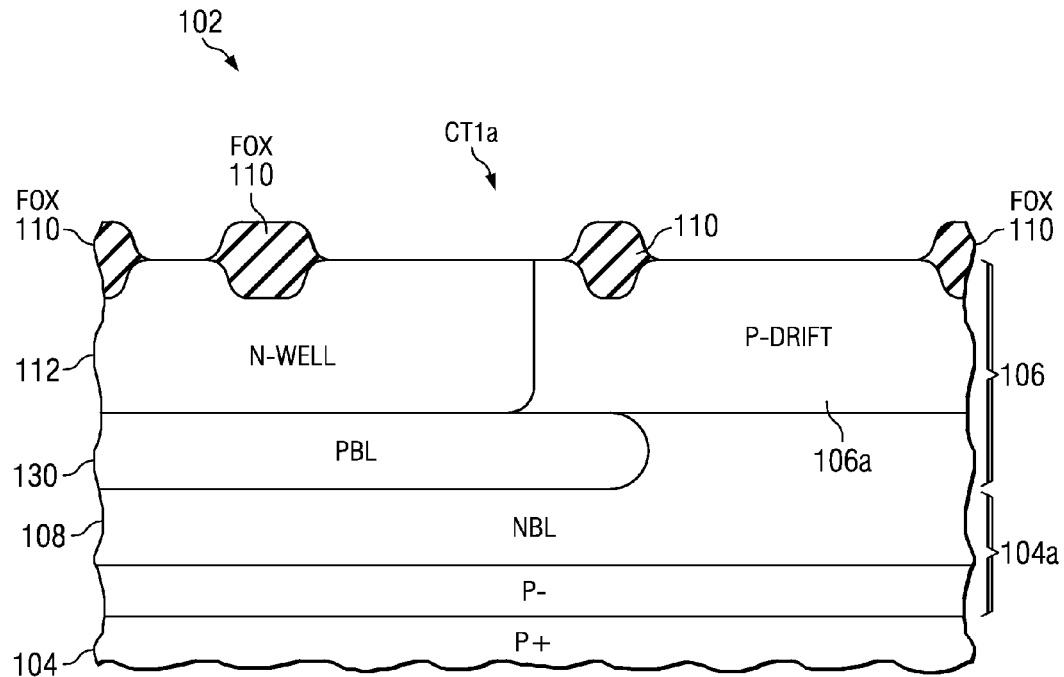

Referring also to FIG. 4D, the n-well 112 is implanted at 216 in a second portion of the epitaxial silicon 106, where the n-well 112 may then be thermally diffused at 218. Any suitable implant masking and implantation process (not shown) may be employed at 218 to form the n-well 112. At 220 in FIG. 3, isolation structures 134 are formed using any suitable techniques, such as local oxidation of silicon (LOCOS), shallow trench isolation techniques (STI), deposited oxide, etc. In the exemplary device 102, field oxide (FOX) structures 110 are formed as illustrated in FIG. 4D.

Figure 4E:
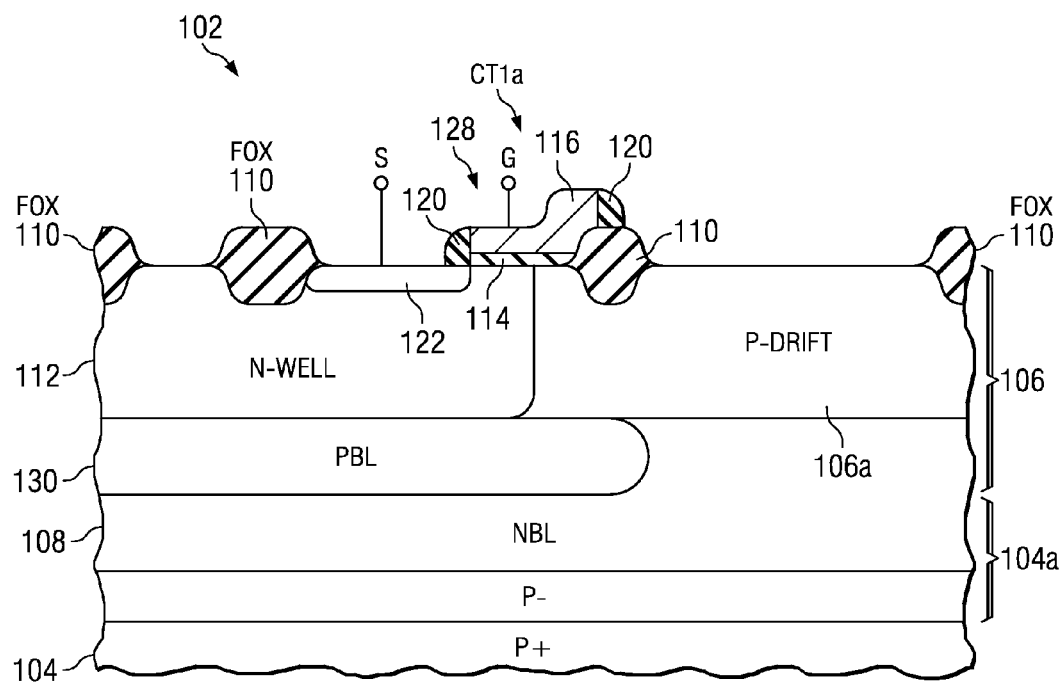

As illustrated in FIG. 4E, a thin gate oxide 114 is formed (e.g. at 222 in the method 202) over the upper surface of the epitaxial layer 106, for example, by thermal oxidation processing or other suitable material formation process (not shown), and a gate polysilicon layer 116 is deposited at 224 over the thin gate oxide 114, and patterned at 226 to form a gate structure 114, 116 extending over the channel region 128 and partially over the p-drift region 106a. With the patterned gate structure formed, LDD, MDD, or other drain extension implants (not shown) are performed at 228, for example, including a shallow p-type implant to initially define the p-type source 122, and sidewall spacers 120 are formed at 230 along the lateral sidewalls of the patterned gate structure 114, 116, as shown in FIG. 4E.

Figure 4F:
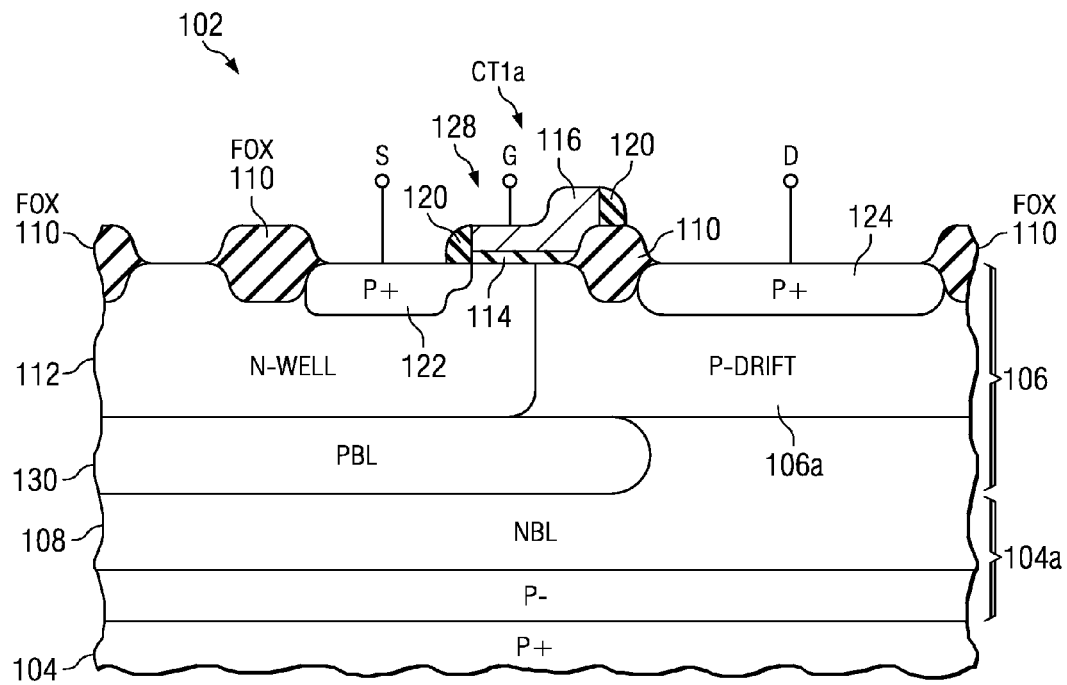
Figure 4G:
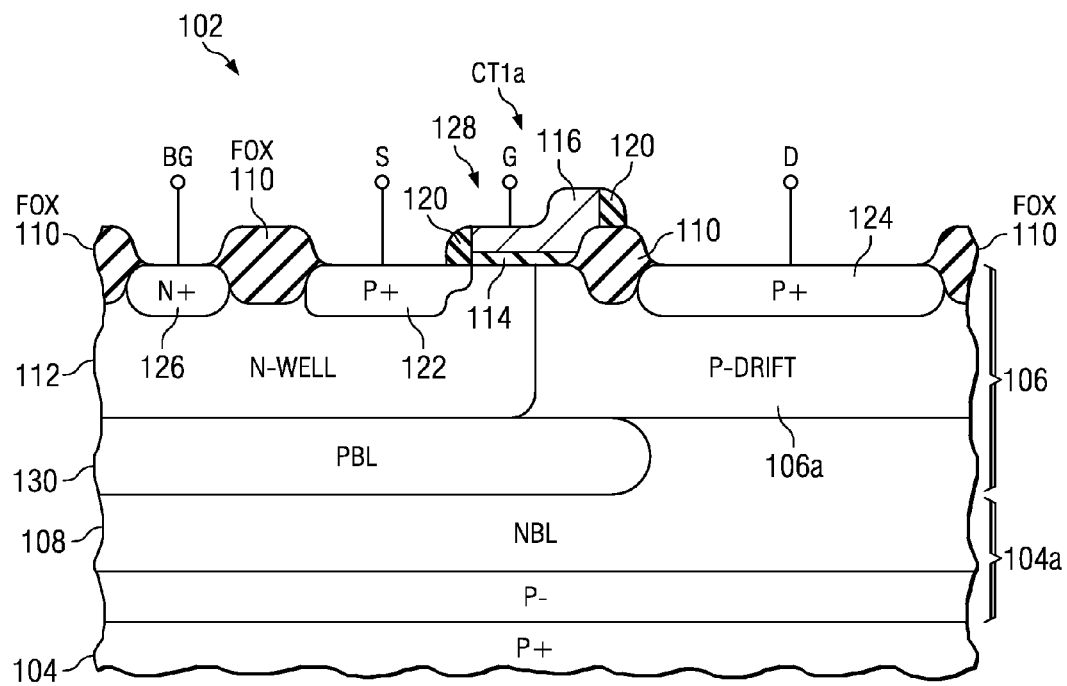

Referring also to FIG. 4F, a p-type source/drain implant is performed at 232 to further define the source 122 within the n-well 112, as well as the drain 124 in the first portion of the p-type upper epitaxial layer 106. As illustrated in FIG. 4G, the backgate 126 is implanted with n-type dopants at 234 in the n-well 112, wherein any suitable masks and implantation processes may be used in forming the p-type source 122, the p-type drain 124, and the n-type backgate 126. Silicide, metalization, and other back-end processing (not shown) are then performed at 236 and 238 to complete the device 102, after which the method 202 ends at 240 in FIG. 3.

Note that although the present examples provided herein are provided in the context of a device having two epi regions with buried layers formed after the lower epi and before the upper epi are provided, the above structure may be formed in the starting material using high energy implants to formed the n-buried layer and the separation layer, respectively, and such variations are contemplated as falling within the scope of the present invention.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of forming a semiconductor device including a drain-extended PMOS transistor, comprising:
   providing a p-type semiconductor substrate;
   forming a p-type lower epitaxial layer over the substrate;
   forming a p-type upper epitaxial layer over the lower epitaxial layer;
   forming an n-type buried layer in a lower portion of the upper epitaxial layer and an upper portion of the lower epitaxial layer;
   forming an n-type well region in an upper portion of the upper epitaxial layer, leaving a p-type drift region outside and lateral to the n-type well region;
   forming a drain-extended PMOS transistor including an n-type backgate above the n-type buried layer; and
   forming a p-type separation region between the n-type buried layer and the n-type backgate electrically separating the n-type buried layer from the n-type backgate; whereby the n-type buried layer is left electrically floating and the potential of the n-type buried layer is defined by a potential applied to the n-type backgate and a potential drop across the p-type separation region;
   wherein forming the n-type buried layer comprises, prior to forming the upper epitaxial layer, implanting n-type dopant to form the n-type buried layer in the lower epitaxial layer; and, following forming the upper epitaxial layer, thermally diffusing the implanted n-type dopant to form the n-type buried layer in the upper epitaxial layer.

2. The method of claim 1, wherein forming the p-type separation region comprises, prior to forming the upper epitaxial layer, implanting p-type dopant over a portion of the n-buried layer; and, following forming the upper epitaxial layer, thermally diffusing the implanted p-type dopant to form the p-type separation region in the upper epitaxial layer.

3. The method of claim 2, wherein forming the n-type well region comprises implanting n-type dopant in the upper epitaxial layer above the p-type separation region.

4. The method of claim 3, wherein forming the drain-extended PMOS transistor comprises forming a transistor gate structure, including a gate electrode over a gate dielectric, over a channel region of the n-type well region and partially over the p-type drift region.

5. The method of claim 4, wherein forming the drain-extended PMOS transistor further comprises implanting p-type dopant to form a source adjacent the gate structure in the n-type well region.

6. The method of claim 5, wherein forming the drain-extended PMOS transistor further comprises implanting p-type dopant to form a drain in the p-type drift region, laterally spaced from the gate structure.

7. The method of claim 6, wherein implanting p-type dopant to form the source region comprises initially defining the source with an initial implant of p-type dopant prior to implanting to form the drain; forming a sidewall spacer on a side of the gate structure after the initial implant; and then, after forming the sidewall spacer, further implanting p-type dopant to further form the source simultaneously with the implanting to form the drain region.

8. The method of claim 6, wherein forming the drain-extended PMOS transistor further includes, implanting n-type dopant to form the n-type backgate in the n-type well region.

9. The method of claim 8, further comprising forming isolation structures at laterally spaced positions in a surface portion of the upper epitaxial layer to separate the source, drain and backgate from one another.

10. The method of claim 9, wherein the drain-extended PMOS transistor is dimensioned and configured so that, in an off state, a portion of a drain-to-source voltage difference is dropped across the p-type separation region between the n-type buried layer and the backgate, and a remainder of the drain-to-source voltage difference is dropped between the drain and the n-type buried layer; the n-type buried layer voltage being set at an intermediate value between the values of the drain and source voltages.

11. The method of claim 10, wherein the p-type separation region is doped with boron to about 3E12 $cm^{-2}$.

12. The method of claim 10, wherein the p-type separation region is doped to provide a drain-extended PMOS transistor breakdown voltage of about 108 volts, wherein the voltage of the n-type buried layer is less than about 80 volts.

13. The method of claim 10, wherein the drain-extended PMOS transistor is dimensioned and configured so that a diode defined by the p-type drift region and the backgate depletes through the p-type separation region before an avalanche breakdown occurs.

* * * * *